United States Patent
Ding

(12) 
(10) Patent No.: US 10,254,659 B1
(45) Date of Patent: Apr. 9, 2019

(54) EXPOSURE APPARATUS AND METHOD FOR EXPOSURE OF TRANSPARENT SUBSTRATE

(71) Applicant: Wuhan China Star Optoelectronics Technology Co., Ltd., Wuhan, Hubei (CN)

(72) Inventor: Lei Ding, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 0 days.

(21) Appl. No.: 15/739,782

(22) PCT Filed: Oct. 18, 2017

(86) PCT No.: PCT/CN2017/106678
§ 371 (c)(1),
(2) Date: Dec. 26, 2017

(30) Foreign Application Priority Data

Sep. 27, 2017 (CN) .......................... 2017 1 0889535

(51) Int. Cl.
*G03F 7/20* (2006.01)

(52) U.S. Cl.
CPC .......... *G03F 7/70716* (2013.01); *G03F 7/707* (2013.01)

(58) Field of Classification Search
CPC .. G03F 7/70691; G03F 7/707; G03F 7/70716; G03F 7/70791
See application file for complete search history.

(56) References Cited

U.S. PATENT DOCUMENTS

| 5,684,856 | A | * | 11/1997 | Itoh | ...................... | G03F 7/70716 250/453.11 |
| 2004/0135979 | A1 | * | 7/2004 | Hazelton | ................ | G03B 27/48 355/51 |
| 2005/0140215 | A1 | | 6/2005 | Korenaga | | |
| 2005/0237510 | A1 | * | 10/2005 | Shibazaki | ........... | G03F 7/70716 355/72 |
| 2007/0008513 | A1 | * | 1/2007 | Chung | .................. | G03F 7/7035 355/72 |

(Continued)

FOREIGN PATENT DOCUMENTS

| CN | 1373900 A | 10/2002 |
| CN | 101354537 A | 1/2009 |

(Continued)

*Primary Examiner* — Steven Whitesell Gordon
(74) *Attorney, Agent, or Firm* — Andrew C. Cheng

(57) ABSTRACT

An exposure apparatus includes a carrying device and a UV light generation device that irradiate a transparent substrate positioned on the carrying device. The carrying device includes a base, a linear electric machine, an exposure table, and a pneumatic lift device that is arranged between the exposure table and the base and supports the exposure table on the base. A stator of the linear electric machine is fixed to the base, and a rotor of the linear electric machine is fixedly coupled to the exposure table. The linear electric machine drives the exposure table to move relative to the base. A method for exposure of a transparent substrate is also provided. The linear electric machine only needs to drive the movement of the exposure table thereby helping increase exposure speed and exposure accuracy. The pneumatic lift device provides an additional function of cushioning.

14 Claims, 7 Drawing Sheets

(56) References Cited

U.S. PATENT DOCUMENTS

2008/0013060 A1* 1/2008 Ichinose ............... F16C 29/025
                                                        355/53
2010/0018950 A1* 1/2010 Aoki ................... G03F 7/70716
                                                        216/41
2012/0064461 A1* 3/2012 Aoki ................... G03F 7/70791
                                                        430/320

FOREIGN PATENT DOCUMENTS

| | | |
|---|---|---|
| CN | 101510056 A | 8/2009 |
| CN | 101609263 A | 12/2009 |
| CN | 103119518 A | 5/2013 |
| CN | 204731527 U | 10/2015 |
| CN | 106292196 A | 1/2017 |
| CN | 106933045 A | 7/2017 |
| CN | 106933051 A | 7/2017 |
| CN | 106933052 A | 7/2017 |
| CN | 107450284 A | 12/2017 |
| WO | 2010128597 A1 | 11/2010 |

\* cited by examiner

EXPOSURE APPARATUS AND METHOD FOR EXPOSURE OF TRANSPARENT SUBSTRATE

CROSS REFERENCE TO RELATED APPLICATIONS

This application claims the priority of Chinese Patent Application No. 2017108895352 filed on Sep. 27, 2017, titled "Exposure Apparatus and Method for Exposure of Transparent Substrate", the disclosure of which is incorporated herein by reference in its entirety.

BACKGROUND OF THE INVENTION

1. Field of the Invention

The present invention relates to the field of display device production technology, and more particularly to an exposure apparatus and a method for exposure of a transparent substrate.

2. The Related Arts

During the fabrication of liquid crystal displays and organic light emitting diode displays, it is necessary to coat a photosensitive material on a glass substrate and to irradiate the photosensitive material with ultraviolet light passing through a mask so as to transfer pattern information from the mask to the photosensitive material, and this is exposure of the photosensitive material to achieve patterning of the photosensitive material for formation a structure, such as a thin-film transistor or a pixel. An optical device that supplies the ultraviolet light is often of high precision and to ensure stability of exit light, it is often to keep the optical device that supplies the ultraviolet light fixed, while an electrical machine is used to drive an exposure table of the exposure machine that supports a glass substrate positioned thereon to move with respect to the ultraviolet light to thereby carry out exposure of a surface of the glass substrate.

In the state of the art, the exposure table is supported on a base by a support mechanism and multiple electrical machines are operated to drive the exposure table and the support mechanism to move simultaneously. With the progress of the liquid crystal panel technology, the glass substrate used in fabrication has been greatly increased in size thereof. For example for a G6 generation glass substrate, the size is 18500 mm×15000 mm and the size of a G11 generation glass substrate is increased to 2940 mm×3370 mm. The sizes and weights of the exposure table and the support mechanism of the exposure machine are both greatly increase, along with the size increase of the glass substrate, and the loadings of the electrical machines that drive the movements of the exposure table and the support mechanisms are also increased. Factors, such as excessive resistance against driving of the electrical machine and severe overheating of the electrical machine, may causes undesired conditions, such as constraints to the exposure speed of the exposure machine and poor accuracy of exposure resulting from vibration of the exposure table, which may affect production efficiency and product yield of manufacturers.

SUMMARY OF THE INVENTION

A technical issue to be addressed in this application is to provide an exposure apparatus and a method for exposure of a transparent substrate, which may overcome the issues concerning production efficiency and product yield of manufacturers resulting from constraint of exposure speed and poor accuracy of exposure caused by exposure table vibration found in a known exposure machine.

In order to overcome the above technical issues, this application provides an exposure apparatus, which comprises a carrying device and an ultraviolet (UV) light generation device, the UV light generation device being operable to irradiate a transparent substrate carried on the carrying device, wherein the carrying device comprises a base, a linear electric machine, an exposure table, and a pneumatic lift device, the pneumatic lift device being arranged between the exposure table and the base, the pneumatic lift device supporting the exposure table on the base, the linear electric machine comprising a stator fixed to the base, the linear electric machine comprising a rotor fixedly coupled to the exposure table, the linear electric machine being operable to drive the exposure table to move relative to the base.

In the above, the pneumatic lift device comprises a main body and a first air bladder and a second air bladder respectively coupled to two opposite sides of the main body, the first air bladder being positioned on the base, the second air bladder abutting and supporting the exposure table, the main body being operable to control inflation or deflection of each of the first air bladder and the second air bladder.

In the above, the first air bladder and the second air bladder are each provided in a plural number and the plural first air bladders and the plurals second air bladder are arranged symmetric with respect to the main body.

In the above, the carrying device further comprises a support frame, the support frame comprising a support board and an extendible vertical post, the support board being fixed through the extendible vertical post to the base, the support board being arranged between the pneumatic lift device and the exposure table, the second air bladder being set in abutting engagement with the support board through the exposure table.

In the above, the exposure apparatus further comprises a shock-resistant chassis, the shock-resistant chassis being adapted to mount through an elastic post to a working plane, the carrying device being mounted to the shock-resistant chassis.

In the above, the shock-resistant chassis comprises a trough formed therein, the trough being provided therein with an electric machine, a screw rod and a nut mounted to the screw rod, the nut being connected to the carrying device, the screw rod being arranged in a direction that forms an angle with respect to a movement direction of the linear electric machine, the electric machine being operable to drive the carrying device to move.

In the above, the exposure table is provided, on a surface thereof facing the base, with rollers, the rollers being in contact engagement with the support board and rollable on the support board.

In the above, the linear electric machine is provided in a number of at least two and the stators of the linear electric machine are mounted, in a symmetric manner, to two opposite sides of the base.

This application also provides a method for exposure of a transparent substrate, which comprises:

providing an exposure apparatus, wherein the exposure apparatus comprises a carrying device and an ultraviolet (UV) light generation device, the carrying device comprising a base, a linear electric machine, an exposure table, and a pneumatic lift device, the pneumatic lift device being arranged between the exposure table and the base, the pneumatic lift device supporting the exposure table on the base, the linear electric machine comprising a stator fixed to the base, the linear electric machine comprising a rotor fixedly coupled to the exposure table;

positioning a transparent substrate having a surface coated with a photosensitive material on the exposure table;

inflating or deflating the pneumatic lift device to adjust a height of the exposure table; and positioning a mask between the transparent substrate and the UV light generation device such that UV light emitting from the UV light generation device is allowed to irradiate the photosensitive material, wherein the linear electric machine is operable to drive the transparent substrate to move relative to the UV light.

In the above, the exposure apparatus further comprises a shock-resistant chassis, the shock-resistant chassis comprising a trough formed therein, the trough being provided therein with an electric machine, a screw rod, and a nut mounted to the screw rod, the nut being connected to the carrying device, wherein during an operation of the linear electric machine driving the transparent substrate to move relative to the UV light, the electric machine drives the transparent substrate to move in a direction that is different from a movement direction of the linear electric machine.

In the above, the pneumatic lift device comprises a main body and a first air bladder and a second air bladder respectively coupled to two opposite sides of the main body, the first air bladder being positioned on the base, the second air bladder abutting and supporting the exposure table, the main body being operable to control inflation or deflection of each of the first air bladder and the second air bladder.

In the above, the first air bladder and the second air bladder are each provided in a plural number and the plural first air bladders and the plurals second air bladder are arranged symmetric with respect to the main body.

In the above, the carrying device further comprises a support frame, the support frame comprising a support board and an extendible vertical post, the support board being fixed through the extendible vertical post to the base, the support board being arranged between the pneumatic lift device and the exposure table, the second air bladder being set in abutting engagement with the support board through the exposure table.

In the above, the exposure apparatus further comprises a shock-resistant chassis, the shock-resistant chassis being adapted to mount through an elastic post to a working plane, the carrying device being mounted to the shock-resistant chassis.

In the above, the exposure table is provided, on a surface thereof facing the base, with rollers, the rollers being in contact engagement with the support board and rollable on the support board.

In the above, the linear electric machine is provided in a number of at least two and the stators of the linear electric machine are mounted, in a symmetric manner, to two opposite sides of the base.

The beneficial efficacy of this application is that the pneumatic lift device supports the exposure table on the base to take the place of a support structure that is of a large size and a great weigh. The linear electric machine drives the exposure table to move relative to the UV light in order to carry out exposure of the transparent substrate. The linear electric machine only needs to drive the movement of the exposure table so that the driving resistance of the linear electric machine is lessened and the amount of heat generated by the electric machine is reduced to help increase the speed of exposure and the accuracy of exposure. Further, the pneumatic lift device provides a function of cushioning to help keep the exposure table stable and horizontal all the time and increase the production efficiency and product yield of the manufacturer.

BRIEF DESCRIPTION OF THE DRAWINGS

To more clearly explain the technical solution proposed in embodiments of this application, a brief description of the drawings that are necessary for describing the embodiments will be given as follows. It is obvious that the drawings that will be described below show only some embodiments of this application. For those having ordinary skills of the art, other drawings may be readily available from these attached drawings without the expense of creative effort and endeavor.

DETAILED DESCRIPTION OF THE PREFERRED EMBODIMENTS

A clear and complete description will be given to technical solutions provided in embodiments of this application with reference to the attached drawings of the embodiments of this application. However, the embodiments so described are only some, but not all, of the embodiments of this application. All other embodiments that are available to those having ordinary skills of the art based on the embodiments described in this application, without the expense of creative effort and endeavor, are considered belonging to the scope of protection of this application.

The embodiment of this application provides an exposure apparatus that is applicable to exposure of a transparent substrate having a surface coated with a photosensitive material. The transparent substrate can be a transparent material, such as a glass substrate or a plastic substrate. Specifically, when the transparent substrate is used to make a color filter substrate, the photosensitive material can be a color resist material and after exposure, the photosensitive material may form pixels that display various colors including red, green, and blue; and when the transparent substrate is used to make an array substrate, the photosensitive material can be a poly-silicon layer, a metal layer, or a semiconductor layer and after exposure and patterning conducted with a mask, the photosensitive material forms a structure, such as an active layer, a gate electrode, and a source and a drain of a thin-film transistor.

Figure 1:
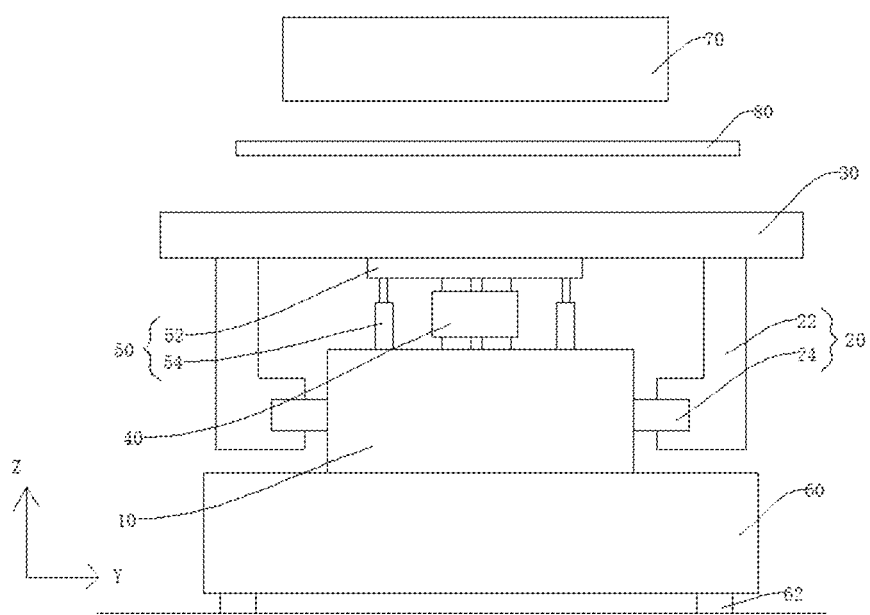
FIG. 1 is a schematic view illustrating a structure of an exposure apparatus provided in an embodiment of this application.
Figure 2:
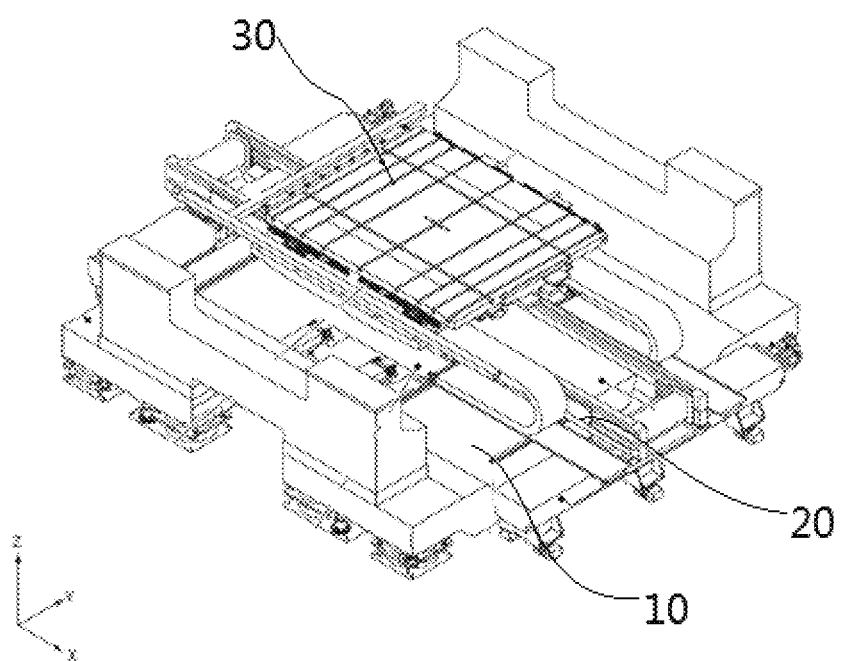
FIG. 2 is a structural diagram of the exposure apparatus provided in the embodiment of this application.
Figure 4:
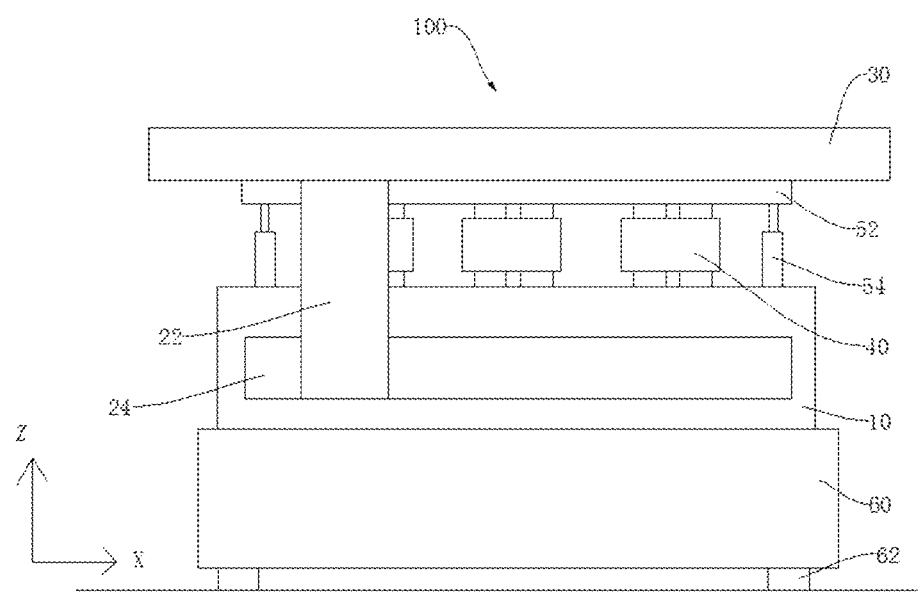
FIG. 4 is a schematic side-elevational view illustrating a carrying device provided in the embodiment of this application.

Referring to FIGS. 1, 2, and 4, an exposure apparatus comprises a carrying device 100 and an ultraviolet (UV)

light generation device 70. The UV light generation device 70 is operable to irradiate a transparent substrate 300 positioned on the carrying device 100. In an embodiment, the UV light generation device 70 comprises an ultra-high voltage mercury lamp, and the ultra-high voltage mercury lamp provides UV light 200 of a sufficient intensity to meet the need for exposure of the transparent substrate 300. In the instant embodiment, the UV light generation device 70 is a position-fixed UV light source, wherein during an exposure process of the transparent substrate 300, a position of the UV light generation device 70 and an output direction of the UV light 200 maintain fixed in order to provide continuation, steadiness, and uniform intensity distribution of irradiation of the UV light 200 onto the transparent substrate 300 to thereby enhance the effectiveness of exposure.

With specific reference to FIG. 1, in the instant embodiment, the carrying device 100 comprises a base 10, a linear electric machine 20, an exposure table 30, and a pneumatic lift device 40. The base 10 functions as a primary carrying foundation of the carrying device 100 and the base 10 possesses the characteristics of large size and great weight in order to maintain overall structural stability of the carrying device 100 and ensures excellent stability of the carrying device 100 during the use thereof. In an embodiment, the base 10 is formed of a marble material and a marble-made base 10 has a great weight and excellent stability. In the instant embodiment, the pneumatic lift device 40 is arranged between the exposure table 30 and the base 10 such that the pneumatic lift device 40 supports the exposure table 30 on the base 10. Specifically, reference being collectively had to FIG. 3, the pneumatic lift device 40 comprises multiple inflatable/deflatable air bladder devices. The pneumatic lift device 40 is arranged between the exposure table 30 and the base 10 and is in abutting engagement with the exposure table 30 and the base 10 so as to position the exposure table 30 on the base 10. When the air bladders of the pneumatic lift device 40 are inflated, the air bladders expand and raise the exposure table 30 upward with respect to the base 10, and when the air bladders of the pneumatic lift device 40 are deflated, the air bladders collapse and lower the exposure table 30 down with respect to the machine. Further, controlling a speed of inflation or deflation of the pneumatic lift device 40 allows for controlling of a speed of raising and lowering down the exposure table 30 and due to flowability of gas, inflation or deflation is generally proceeding uniformly through the air bladders of the pneumatic lift device 40, meaning the air bladders, as a whole, get expanded or collapsed in a generally uniform manner so that the exposure table 30 is constantly kept stable during raising or lowering down. In an embodiment, multiple ones of the pneumatic lift device 40 are arranged between the exposure table 30 and the base 10 and the multiple pneumatic lift devices 40 are uniformly distributed so that the pneumatic lift devices 40 may support the exposure table 30 at multiple points to keep the exposure table 30 stable. Further, the multiple pneumatic lift devices 40 may get inflated or deflated simultaneously, meaning the air bladders of each of the pneumatic lift devices 40 are provided with the same amount of air so that each air bladder has the same volume to make each of the points of contact between the exposure table 30 and the pneumatic lift devices 40 has the same height and thus, the exposure table 30 maintain horizontal during the process of raising or lowering down and the transparent substrate 300 positioned on the exposure table 30 is kept at a fixed distance from the UV light generation device 70 to ensure uniform irradiation of the UV light 200 onto the transparent substrate 300 and a bettered effect of exposure.

In the instant embodiment, the linear electric machine 20 comprises a stator 24 that is fixed to the base 10, and the linear electric machine 20 comprises a rotor 22 that is fixedly coupled to the exposure table 30. The linear electric machine 20 is operable to drive the exposure table 30 to move with respect to the base 10. Specifically, the linear electric machine 20 is a driving device that converts electrical energy into mechanical energy of the rotor 22 to drive a linear motion of the stator 24. The linear electric machine 20 is characterized by stable controllability of motion, great acceleration, and high accuracy. The stator 24 is fixedly connected to the base 10 by means of screws, and the rotor 22 is also fixedly coupled to the exposure table 30 by means of screws. When being driven with electrical power, the rotor 22 conducts a linear motion by sliding with respect to the stator 24 so as to cause the exposure table 30 to move relative to the base 10. Due to linear movement of the rotor 22 of the linear electric machine 20 with respect to the stator 24, the exposure table 30 also conducts a linear movement with respect to the base 10 (in an X-axis direction shown in the drawings), and the direction of movement of the exposure table 30 is steady and can be easily controlled. In the instant embodiment, during the linear movement of the rotor 22 with respect to the stator 24, a resistive force that resist the movement of the rotor 22 with respect to the stator 24 is determined by the weight of the exposure table 30 carried by the rotor 22 and compared to the known techniques, the rotor 22 does not need to carry the weight of other structures, such as the support mechanism, so that the driving resistance of the linear electric machine 20 is lessened and the amount of heat generated by the operation of the linear electric machine 20 is reduced, the acceleration thereof can be made large to thereby help increase the speed of exposure. Further, mechanical vibration is inevitably generated during the motion of the rotor 22 with respect to the stator 24 and the mechanical vibration causes the exposure table 30 to vibrate and thus making the effect of irradiation of the UV light 200 onto the transparent substrate 300 poor and affecting the effect of exposure. The instant embodiment provides an arrangement that the pneumatic lift device 40 is placed between the base 10 and the exposure table 30 of the carrying device 100 to provide an effect of cushioning for reducing the vibration of the exposure table 30 and thus enhancing stability of the exposure table 30 during the movement thereof to improve the effect of exposure, increase accuracy of exposure, and increase product yield.

The pneumatic lift device 40 supports the exposure table 30 on the base 10 in order to take the place of the support structure that is of a large size and a great weight. The linear electric machine 20 drives the exposure table 30 to move relative to the UV light 200 to carry out exposure of the transparent substrate 300. The linear electric machine 20 only needs to drive the movement of the exposure table 30 so that the driving resistance of the linear electric machine 20 is reduced and the amount of heat generated by the electric machine is small thereby helping increase exposure speed and exposure accuracy. In addition, the pneumatic lift device 40 provides an effect of cushioning to help the exposure table 30 to maintain stable and horizontal all the time to thus improve production efficiency and product yield of the manufacturer.

Figure 3:
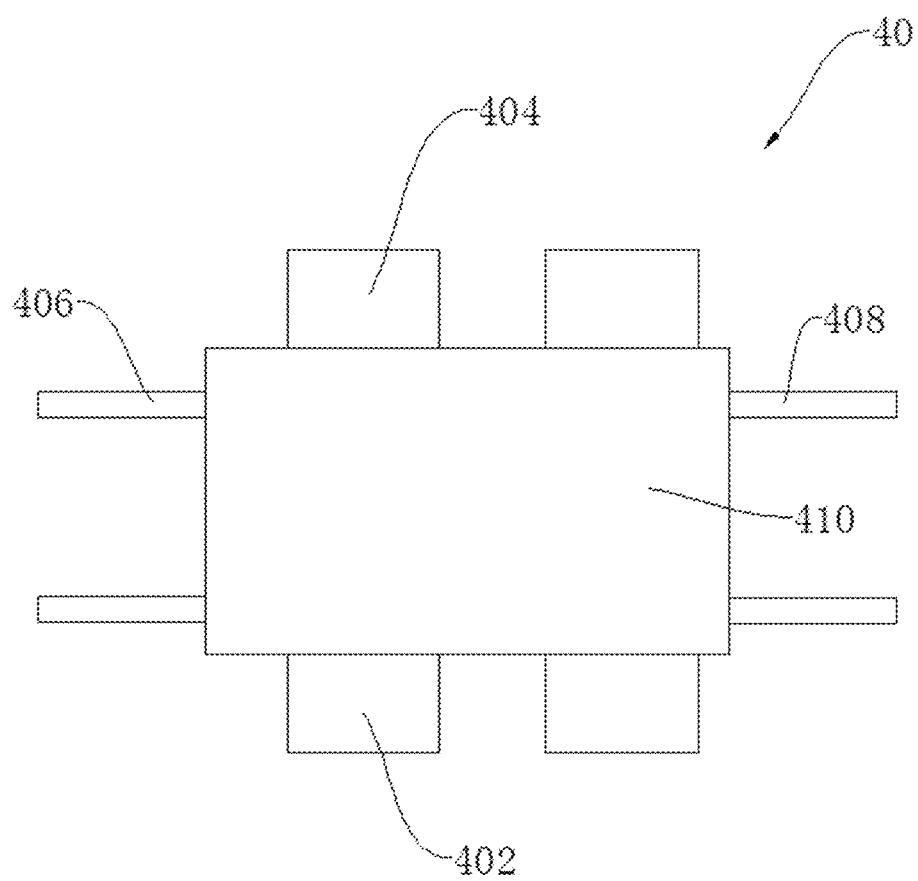
FIG. 3 is a schematic view illustrating a pneumatic lift device provided in the embodiment of this application.

With specific reference to FIG. 3, in the instant embodiment, the pneumatic lift device 40 comprises a main body 410 and a first air bladder 402 and a second air bladder 404 respectively connected to two opposite sides of the main body 410. The first air bladder 402 is positioned on the base 10 and the second air bladder 404 abuts and supports the exposure table 30. The main body 410 is operable to inflate or deflate the first air bladder 402 and the second air bladder 404. Specifically, the first air bladder 402 is in abutting engagement with the base 10 and the second air bladder 404 is in abutting engagement with the exposure table 30, and the main body 410 is operable to charge air into the first air bladder 402 and the second air bladder 404 to raise the exposure table 30 upward. The main body 410 is provided therein with devices, such as an air pump, an ingress pipe 406, and an egress pipe 408, in order to carry out an operation of inflation or deflation of the first air bladder 402 and the second air bladder 404 and to maintain a stable pneumatic pressure of the first air bladder 402 and the second air bladder 404. With the two opposite sides of the main body 410 being respectively provided with air bladders (the first air bladder 402 and the second air bladder 404), stability of operation of the pneumatic lift device 40 is improved, support to the exposure table 30 is enhanced, and an effect of cushioning for the exposure table 30 is bettered so as to further improve operation stability of the exposure table 30, enhance the exposure effect, and increase product yield.

In the instant embodiment, the first air bladder 402 and the second air bladder 404 so used each involve a plural number and the plural first air bladders 402 and second air bladders 404 are both arranged symmetric with respect to the main body 410. Specifically, each main body 410 is provided with plural first air bladders 402 and plural second air bladders 404 to improve stability of the pneumatic lift device 40. The locations of the first air bladders 402 and the second air bladders 404 are arranged symmetric to provide a balanced and stable effect of supporting to the exposure table 30 by the pneumatic lift device 40 and prevent a situation of imbalance of supporting forces of the exposure table 30 by the pneumatic lift device 40.

Referring to FIGS. 1 and 4 in combination, the carrying device 100 may further comprise a support frame 50. The support frame 50 comprises a support board 52 and extendible vertical posts 54. The support board 52 is coupled by means of the extendible vertical posts 54 to the base 10. The support board 52 is located between the pneumatic lift device 40 and the exposure table 30. The second air bladder 404 is set in abutting engagement, through the support board 52, to the exposure table 30. Specifically, the support board 52 is a structure that interface between the pneumatic lift device 40 and the exposure table 30 and the support board 52 has two opposite surfaces that are in direct engagement with the second air bladder 404 and the exposure table 30. The second air bladder 404 has no surface in direct contact with the exposure table 30 to prevent damage of the second air bladder 404 resulting from abrasion of the second air bladder 404 caused by the exposure table 30 during the motion thereof and an increased vibration of the exposure table 30 caused by friction between the exposure table 30 and the second air bladder 404. In the instant embodiment, the support board 52 is fixed, by means of the extendible vertical posts 54, to the base 10. The extendible vertical posts 54 are each a column structure having a variable length. The extendible vertical posts 54 may each be a spring post 62 or two telescopically coupled upright rods. When the pneumatic lift device 40 inflates, the support board 52 is raised and the extendible vertical posts 54 elongate; and when the pneumatic lift device 40 deflates, the support board 52 lowers down and the extendible vertical posts 54 shorten. The extendible vertical posts 54 provide an effect of supporting and holding the support board 52 so that the support board 52 is kept fixed to the base 10. During the movement of the exposure table 30 in the X-axis direction, the extendible vertical posts 54 that are fixed with the support board 52 are not moved by a frictional force applied by the exposure table 30 to the support board 52.

In the instant embodiment, the exposure apparatus further comprises a shock-resistant chassis 60. The shock-resistant chassis 60 is fixed, by means of elastic support posts, to a fixed work plane. The carrying device 100 is fixed on the shock-resistant chassis 60. Specifically, the shock-resistant chassis 60 is greater, in respect of size and weight, than the carrying device 100. The shock-resistant chassis 60 is directly set up, through spring posts 62, on the ground or a work platform. The shock-resistant chassis 60 prevents the exposure apparatus from being affected by the external environment, such as the ground or the work platform, and provides the carrying device 100 with a stable operation environment to thereby help improve the exposure effect and increase product yield.

Figure 5:
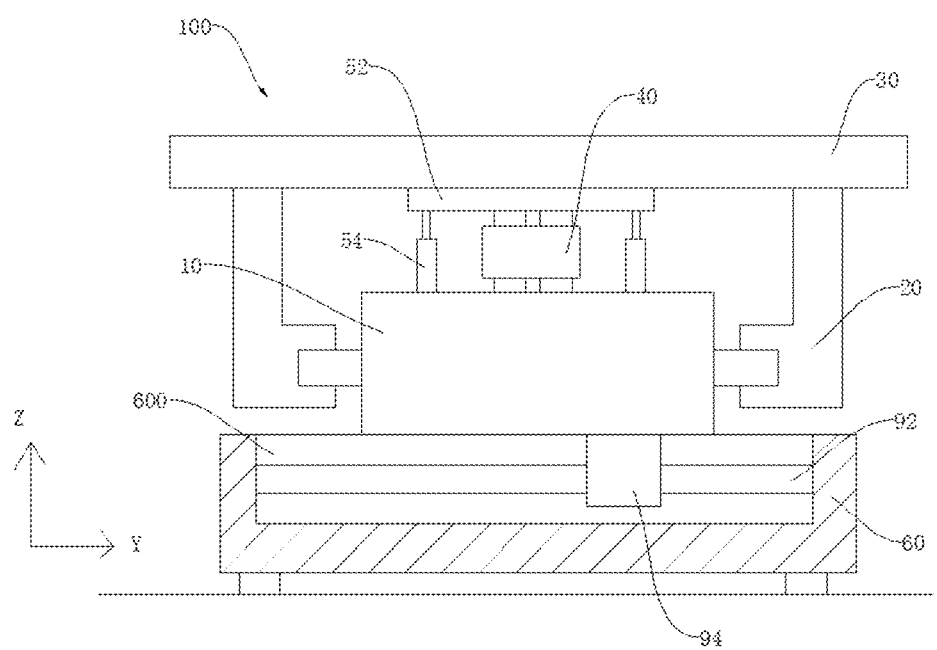
FIG. 5 is a schematic front view, partly sectioned, illustrating the carrying device provided in the embodiment of the present invention.

Referring to FIG. 5, in the instant embodiment, the shock-resistant chassis 60 is provided with a trough 600. The trough 600 is provided therein with an electric machine, a screw rod 92, and a nut 94 mounted to the screw rod 92. The nut 94 is coupled to the carrying device 100. The screw rod 92 is arranged in a direction that forms an angle with respect to a movement direction of the linear electric machine 20. The electric machine drives the carrying device 100 to move. In an embodiment, the screw rod 92 is arranged in a direction that is generally perpendicular to the movement direction of the linear electric machine 20, namely in the direction of a Y-axis shown in the drawings. The electric machine drives, through a combination of the screw rod 92 and the nut 94, the carrying device 100 to move in the Y-axis direction. In other words, the electric machine drives the exposure table 30 to move in the Y-axis direction. By means of the X-axis direction movement and the Y-axis direction movement, the exposure table 30 is movable on a horizontal plane and is movable to any location with a range of stroke. In an embodiment, the electric machine that drives the screw rod 92 to rotate is a step motor. The operative combination of the screw rod 92 and the nut 94 provides a large driving force to drive the carrying device 100 to move in the entirety thereof so as to meet the need for horizontal movement of the exposure table 30.

Figure 6:
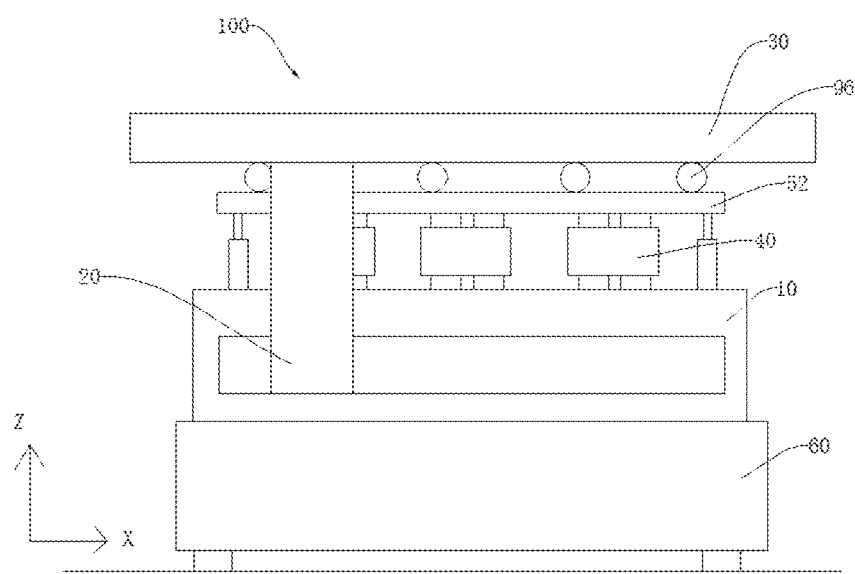
FIG. 6 is a schematic side-elevational view illustrating a carrying device provided in the embodiment of this application.

Referring to FIG. 6, in an embodiment, the exposure table 30 is provided, on a surface thereof facing the base 10, with rollers 96. The rollers 96 are in contact with the support board 52 and are rollable on the support board 52. Specifically, the rollers 96 are arranged on the exposure table 30 and a direction of a rotational axis of each of the rollers 96 is perpendicular to the movement direction of the linear electric machine 20. The rollers 96 function to convert sliding friction between the exposure table 30 and the support board 52 into rolling friction so as to reduce, to some extents, the loading of the linear electric machine 20 and reduce mechanical vibration to thereby increase the exposure speed and improve stability of exposure.

Referring to FIG. 1, in the embodiment, the linear electric machine 20 so used involves a number of at least two and the stators 24 of these linear electric machines 20 are arranged, in a symmetric manner, on two opposite sides of the base 10. Specifically, an even number of linear electric machines 20 are arranged symmetrically on the two sides of the base 10 to provide symmetric forces to the exposure table 30 to help keep the movement of the exposure table 30 stable and improve the exposure effect.

The pneumatic lift device 40 supports the exposure table 30 on the base 10 to take the place of a support structure that is of a large size and a great weigh. The linear electric machine 20 drives the exposure table 30 to move relative to the UV light 200 in order to carry out exposure of the transparent substrate 300. The linear electric machine 20 only needs to drive the movement of the exposure table 30 so that the driving resistance of the linear electric machine 20 is lessened and the amount of heat generated by the electric machine is reduced to help increase the speed of exposure and the accuracy of exposure. Further, the pneumatic lift device 40 provides a function of cushioning to help keep the exposure table 30 stable and horizontal all the time and increase the production efficiency and product yield of the manufacturer.

Figure 7:
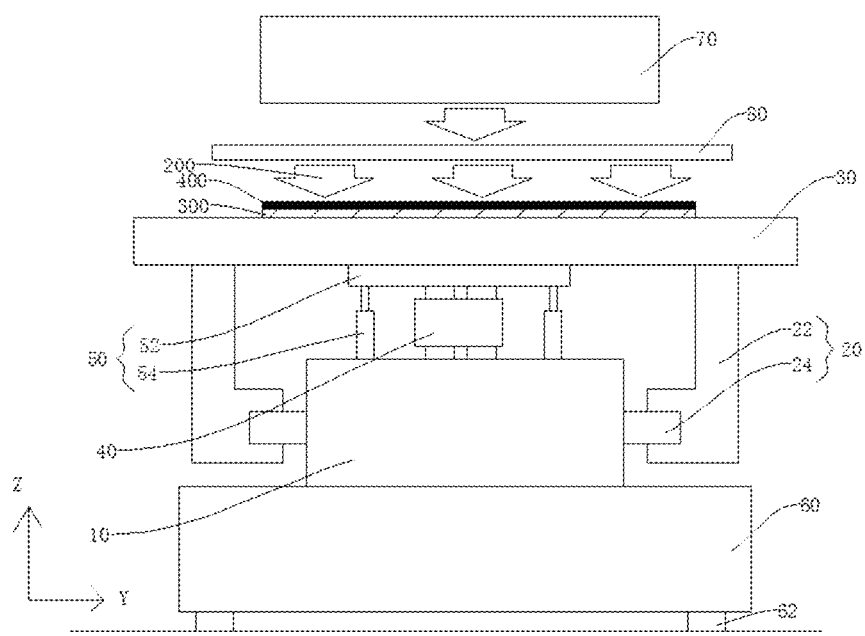
FIG. 7 is a schematic view demonstrating a method for exposure of a transparent substrate provided in an embodiment of this application.

Referring to FIG. 7, an embodiment of this application also provides a method for exposure of a transparent substrate 300. Specifically, the transparent substrate 300 is a glass substrate or a plastic substrate. The method for exposure of the transparent substrate 300 is conducted with the exposure apparatus provided in the embodiment of this application. Specifically, the exposure apparatus comprises the carrying device 100 and the UV light generation device 70, and the carrying device 100 comprises the base 10, the linear electric machine 20, the exposure table 30, and the pneumatic lift device 40, wherein the pneumatic lift device 40 is arranged between the exposure table 30 and the base 10; the pneumatic lift device 40 supports the exposure table 30 on the base 10; the stator 24 of the linear electric machine 20 is fixed to the base 10, and the rotor 22 of the linear electric machine 20 is fixedly coupled to the exposure table 30.

The method for exposure of the transparent substrate 300 comprises the following specific steps:

S101: positioning a transparent substrate 300 having a surface coated with a photosensitive material 400 on the exposure table 30.

In the instant embodiment, Specifically, when the transparent substrate 300 is used to make a color filter substrate, the photosensitive material 400 can be a color resist material and after exposure, the photosensitive material 400 may form pixels that display various colors including red, green, and blue; and when the transparent substrate 300 is used to make an array substrate, the photosensitive material 400 can be a poly-silicon layer, a metal layer, or a semiconductor layer and after exposure and patterning conducted with a mask, the photosensitive material 400 forms a structure, such as an active layer, a gate electrode, and a source and a drain of a thin-film transistor.

In an embodiment, the photosensitive material 400 is formed on a surface of the transparent substrate 300 by means of chemical vapor deposition.

S102: inflating or deflating the pneumatic lift device 40 to adjust a height of the exposure table 30.

In the instant embodiment, the height of the exposure table 30 is adjustable through inflation or deflation of an air bladder of the pneumatic lift device 40. Specifically, when the air bladder of the pneumatic lift device 40 is inflated, the air bladder expands to raise the exposure table 30 upward with respect to the base 10 and when the air bladder of the pneumatic lift device 40 is deflated, the air bladder collapses and the exposure table 30 lowers down with respect to the machine. Further, controlling a speed of inflation or deflation of the pneumatic lift device 40 allows for controlling of a speed of raising and lowering down the exposure table 30 and due to flowability of gas, inflation or deflation is generally proceeding uniformly through the air bladder of the pneumatic lift device 40, meaning the air bladder, as a whole, gets expanded or collapsed in a generally uniform manner so that the exposure table 30 is constantly kept stable during raising or lowering down.

The adjustment of the height of the exposure table 30 allows for setting a distance between the transparent substrate 300 and the UV light 200 within a suitable range to meet the needs for exposure.

S103: positioning a mask between the transparent substrate 300 and the UV light generation device 70 such that UV light 200 emitting from the UV light generation device 70 is allowed to irradiate the photosensitive material 400, wherein the linear electric machine 20 drives the transparent substrate 300 to move relative to the UV light 200.

The linear electric machine 20 is characterized by stable controllability of motion, great acceleration, and high accuracy. The stator 24 is fixedly connected to the base 10 by means of screws, and the rotor 22 is also fixedly coupled to the exposure table 30 by means of screws. When being driven with electrical power, the rotor 22 conducts a linear motion by sliding with respect to the stator 24 so as to cause the exposure table 30 to move relative to the base 10. Due to linear movement of the rotor 22 of the linear electric machine 20 with respect to the stator 24, the exposure table 30 also conducts a linear movement with respect to the base 10 (in the X-axis direction shown in the drawings), and the direction of movement of the exposure table 30 is steady and can be easily controlled. In the instant embodiment, during the linear movement of the rotor 22 with respect to the stator 24, a resistive force that resist the movement of the rotor 22 with respect to the stator 24 is determined by the weight of the exposure table 30 carried by the rotor 22 and compared to the known techniques, the rotor 22 does not need to carry the weight of other structures, such as the support mechanism, so that the driving resistance of the linear electric machine 20 is lessened and the amount of heat generated by the operation of the linear electric machine 20 is reduced, the acceleration thereof can be made large to thereby help increase the speed of exposure. Further, mechanical vibration is inevitably generated during the motion of the rotor 22 with respect to the stator 24 and the mechanical vibration causes the exposure table 30 to vibrate and thus making the effect of irradiation of the UV light 200 onto the transparent substrate 300 poor and affecting the effect of exposure. The instant embodiment provides an arrangement that the pneumatic lift device 40 is placed between the base 10 and the exposure table 30 of the carrying device 100 to provide an effect of cushioning for reducing the vibration of the exposure table 30 and thus enhancing stability of the exposure table 30 during the movement thereof to improve the effect of exposure, increase accuracy of exposure, and increase product yield.

In the instant embodiment, the exposure apparatus further comprises a shock-resistant chassis 60. The shock-resistant chassis 60 is provided with a trough 600. T The trough 600 is provided therein with an electric machine, a screw rod 92, and a nut 94 mounted to the screw rod 92. The nut 94 is coupled to the carrying device 100. During the linear electric machine 20 driving the transparent substrate 300 to move relative to the UV light 200, the electric machine drives the transparent substrate 300 to move in a direction that is different from the movement direction of the linear electric machine 20. In an embodiment, the screw rod 92 is arranged in a direction that is generally perpendicular to the movement direction of the linear electric machine 20, namely in the direction of the Y-axis shown in the drawings. The electric machine drives, through a combination of the screw rod 92 and the nut 94, the carrying device 100 to move in the Y-axis direction. In other words, the electric machine drives the exposure table 30 to move in the Y-axis direction. By means of the X-axis direction movement and the Y-axis direction movement, the exposure table 30 is movable on a horizontal plane and is movable to any location with a range of stroke. In an embodiment, the electric machine that drives the screw rod 92 to rotate is a step motor. The operative combination of the screw rod 92 and the nut 94 provides a large driving force to drive the carrying device 100 to move in the entirety thereof so as to meet the need for horizontal movement of the exposure table 30.

The pneumatic lift device 40 supports the exposure table 30 on the base 10 to take the place of a support structure that is of a large size and a great weigh. The linear electric machine 20 drives the exposure table 30 to move relative to the UV light 200 in order to carry out exposure of the transparent substrate 300. The linear electric machine 20 only needs to drive the movement of the exposure table 30 so that the driving resistance of the linear electric machine 20 is lessened and the amount of heat generated by the electric machine is reduced to help increase the speed of exposure and the accuracy of exposure. Further, the pneumatic lift device 40 provides a function of cushioning to help keep the exposure table 30 stable and horizontal all the time and increase the production efficiency and product yield of the manufacturer.

The above disclosure provides one some of the preferred embodiments of this application and are surely not limiting to the scope of the claims of this application. For those having ordinary skills in the art, it can be appreciated that modifications and variations that are made as equivalents to what claimed in the appended claims to practice the entire process or a part of the process of the above embodiments are considered belonging to the scope covered by this application.

What is claimed is:

1. An exposure apparatus, comprising a carrying device and an ultraviolet (UV) light generation device, the UV light generation device being operable to irradiate a transparent substrate carried on the carrying device, wherein the carrying device comprises a base, a linear electric machine, an exposure table, and a pneumatic lift device, the pneumatic lift device being arranged between the exposure table and the base, the pneumatic lift device supporting the exposure table on the base, the linear electric machine comprising a stator fixed to the base, the linear electric machine comprising a rotor fixedly coupled to the exposure table, the linear electric machine being operable to drive the exposure table to move relative to the base; and wherein the pneumatic lift device comprises a main body and a first air bladder and a second air bladder respectively coupled to two opposite sides of the main body, the first air bladder being positioned on the base, the second air bladder abutting and supporting the exposure table, the main body being operable to control inflation or deflection of each of the first air bladder and the second air bladder.

2. The exposure apparatus according to claim 1, wherein the first air bladder and the second air bladder are each provided in a plural number and the plural first air bladders and the plurals second air bladder are arranged symmetric with respect to the main body.

3. The exposure apparatus according to claim 2, wherein the carrying device further comprises a support frame, the support frame comprising a support board and an extendible vertical post, the support board being fixed through the extendible vertical post to the base, the support board being arranged between the pneumatic lift device and the exposure table, the second air bladder being set in abutting engagement with the support board through the exposure table.

4. The exposure apparatus according to claim 3, wherein the exposure apparatus further comprises a shock-resistant chassis, the shock-resistant chassis being adapted to mount through an elastic post to a working plane, the carrying device being mounted to the shock-resistant chassis.

5. The exposure apparatus according to claim 4, wherein the shock-resistant chassis comprises a trough formed therein, the trough being provided therein with an electric machine, a screw rod and a nut mounted to the screw rod, the nut being connected to the carrying device, the screw rod being arranged in a direction that forms an angle with respect to a movement direction of the linear electric machine, the electric machine being operable to drive the carrying device to move.

6. The exposure apparatus according to claim 3, wherein the exposure table is provided, on a surface thereof facing the base, with rollers, the rollers being in contact engagement with the support board and rollable on the support board.

7. The exposure apparatus according to claim 1, wherein the linear electric machine is provided in a number of at least two and the stators of the linear electric machine are mounted, in a symmetric manner, to two opposite sides of the base.

8. A method for exposure of a transparent substrate, comprising:

providing an exposure apparatus, wherein the exposure apparatus comprises a carrying device and an ultraviolet (UV) light generation device, the carrying device comprising a base, a linear electric machine, an exposure table, and a pneumatic lift device, the pneumatic lift device being arranged between the exposure table and the base, the pneumatic lift device supporting the exposure table on the base, wherein the pneumatic lift device comprises a main body and a first air bladder and a second air bladder respectively coupled to two opposite sides of the main body, the first air bladder being positioned on the base, the second air bladder abutting and supporting the exposure table, the main body being operable to control inflation or deflection of each of the first air bladder and the second air bladder, the linear electric machine comprising a stator fixed to the base, the linear electric machine comprising a rotor fixedly coupled to the exposure table;

positioning a transparent substrate having a surface coated with a photosensitive material on the exposure table;

inflating or deflating the pneumatic lift device to adjust a height of the exposure table; and positioning a mask between the transparent substrate and the UV light generation device such that UV light emitting from the UV light generation device is allowed to irradiate the photosensitive material, wherein the linear electric machine is operable to drive the transparent substrate to move relative to the UV light.

9. The method for exposure of a transparent substrate according to claim 8, wherein the exposure apparatus further comprises a shock-resistant chassis, the shock-resistant chassis comprising a trough formed therein, the trough being provided therein with an electric machine, a screw rod, and a nut mounted to the screw rod, the nut being connected to the carrying device, wherein during an operation of the linear electric machine driving the transparent substrate to move relative to the UV light, the electric machine drives the transparent substrate to move in a direction that is different from a movement direction of the linear electric machine.

10. The method for exposure of a transparent substrate according to claim 8, wherein the first air bladder and the second air bladder are each provided in a plural number and the plural first air bladders and the plurals second air bladder are arranged symmetric with respect to the main body.

11. The method for exposure of a transparent substrate according to claim 10, wherein the carrying device further comprises a support frame, the support frame comprising a support board and an extendible vertical post, the support board being fixed through the extendible vertical post to the base, the support board being arranged between the pneumatic lift device and the exposure table, the second air bladder being set in abutting engagement with the support board through the exposure table.

12. The method for exposure of a transparent substrate according to claim 11, wherein the exposure apparatus further comprises a shock-resistant chassis, the shock-resistant chassis being adapted to mount through an elastic post to a working plane, the carrying device being mounted to the shock-resistant chassis.

13. The method for exposure of a transparent substrate according to claim 12, wherein the exposure table is provided, on a surface thereof facing the base, with rollers, the rollers being in contact engagement with the support board and rollable on the support board.

14. The method for exposure of a transparent substrate according to claim 8, wherein the linear electric machine is provided in a number of at least two and the stators of the linear electric machine are mounted, in a symmetric manner, to two opposite sides of the base.

\* \* \* \* \*